(12) United States Patent
Kato (10) Patent No.: US 11,509,290 B2
(45) Date of Patent: Nov. 22, 2022

(54) FILTER AND MULTIPLEXER (71) Applicant: Murata Manufacturing Co., Ltd., Nagaokakyo (JP)

(72) Inventor: Masanori Kato, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 874 days.

(21) Appl. No.: 16/401,512

(22) Filed: May 2, 2019

(65) Prior Publication Data
US 2020/0028490 A1   Jan. 23, 2020

(30) Foreign Application Priority Data

Jul. 18, 2018 (JP) .............................. JP2018-134665

(51) Int. Cl.
*H03H 9/64* (2006.01)
*H03H 9/25* (2006.01)
*H03H 7/01* (2006.01)

(52) U.S. Cl.
CPC ........ *H03H 9/6406* (2013.01); *H03H 7/1766* (2013.01); *H03H 9/25* (2013.01)

(58) Field of Classification Search
CPC ....... H03H 9/6406; H03H 7/1766; H03H 9/25
USPC ..................................................... 310/313 R
See application file for complete search history.

(56) References Cited

U.S. PATENT DOCUMENTS

| 2012/0286900 A1 | 11/2012 | Kadota et al. |
| 2016/0149556 A1 | 5/2016 | Kando |
| 2016/0191014 A1 | 6/2016 | Khlat et al. |
| 2017/0005639 A1 | 1/2017 | Khlat et al. |
| 2017/0134005 A1 | 5/2017 | Takeuchi et al. |
| 2017/0294896 A1 | 10/2017 | Nosaka |

FOREIGN PATENT DOCUMENTS

| CN | 111684718 A | * | 9/2020 | ............... H03H 9/25 |
| KR | 10-2012-0096108 A | | 8/2012 | |
| KR | 10-2017-0097740 A | | 8/2017 | |
| WO | 2015/025651 A1 | | 2/2015 | |
| WO | 2016/013659 A1 | | 1/2016 | |

\* cited by examiner

*Primary Examiner* — Hafizur Rahman (57) ABSTRACT

A filter includes a series arm resonator that defines at least a portion of a signal path connected between first and second terminals, a parallel arm resonator including one end that is grounded, a first inductor including one end that is connected to one end of the series arm resonator and another end that is connected to another end of the parallel arm resonator, and a second inductor including one end that is connected to another end of the series arm resonator and another end that is connected to the other end of the parallel arm resonator. A relative band width of the parallel arm resonator is smaller than a relative band width of the series arm resonator.

14 Claims, 6 Drawing Sheets

FIG. 1

FIG. 2 ANT-HB BANDPASS CHARACTERISTIC

FIG. 3

FIG. 4       P1-P2 BANDPASS CHARACTERISTIC

FIG. 5       RESONANCE CHARACTERISTIC

FIG. 6A (a) REFLECTION CHARACTERISTIC (b) BANDPASS CHARACTERISTIC

FILTER AND MULTIPLEXER

CROSS REFERENCE TO RELATED APPLICATIONS

This application claims the benefit of priority to Japanese Patent Application No. 2018-134665 filed on Jul. 18, 2018. The entire contents of this application are hereby incorporated herein by reference.

BACKGROUND OF THE INVENTION

1. Field of the Invention

The present invention relates to a filter and a multiplexer.

2. Description of the Related Art

There are communication devices that support a plurality of frequency bands (multi-band) and a plurality of wireless methods (multi-mode). A multiplexer that multiplexes and demultiplexes signals of a plurality of frequency bands is used in a front end circuit of such a communication device. A multiplexer includes a plurality of filters having different pass bands from each other, for example.

US Patent Application Publication No. 2016/0191014 discloses a high-frequency circuit that is effectively used as a band pass filter.

Figure 13:
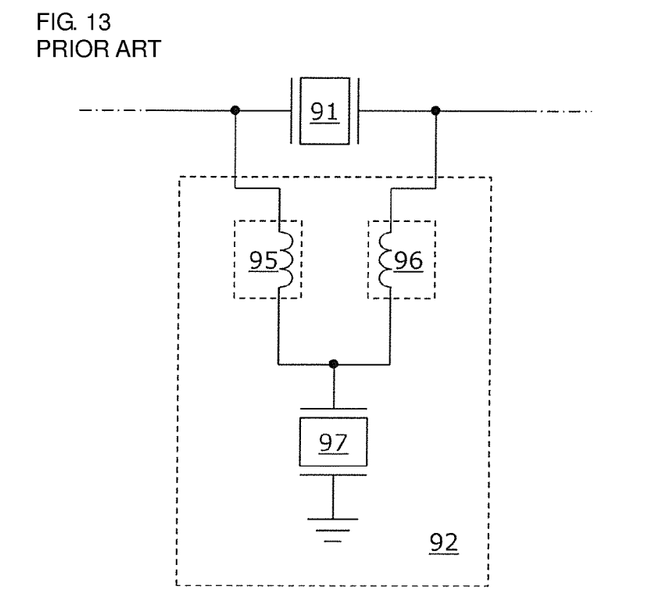
FIG. 13 is a circuit diagram illustrating an example of a high-frequency circuit of the related art.

FIG. 13 is a circuit diagram illustrating an example of a high-frequency circuit disclosed in US Patent Application Publication No. 2016/0191014. The reference symbols used in FIG. 13 have been appropriately changed from the reference symbols used in US Patent Application Publication No. 2016/0191014.

The high-frequency circuit illustrated in FIG. 13 includes an elastic wave resonator 91 and a parallel capacitance compensation circuit 92. The parallel capacitance compensation circuit 92 includes inductors 95 and 96 and an elastic wave resonator 97.

Recently, with the opening up of new frequency bands and the increasingly narrow gaps between frequency bands, there is a demand for the filters of multiplexers to have a wide pass band, a small insertion loss, and a steep attenuation characteristic at an end of the pass band.

SUMMARY OF THE INVENTION

Preferred embodiments of the present invention provide filters each having a wide pass band, a small insertion loss, and a steep attenuation characteristic at an end of the pass band, and multiplexers in which the filters are provided.

A filter according to a preferred embodiment of the present invention includes a series arm resonator that defines at least a portion of a signal path connected between a first terminal and a second terminal; a parallel arm resonator including one end that is grounded; a first inductor including one end that is connected to one end of the series arm resonator and another end that is connected to another end of the parallel arm resonator; and a second inductor including one end that is connected to another end of the series arm resonator and another end that is connected to the another end of the parallel arm resonator. A relative band width of the series arm resonator is larger than a relative band width of the parallel arm resonator.

With the filter according to the above-described preferred embodiment of the present invention, the resonant frequency of the series arm resonator is able to be moved farther away from the high-frequency end of the pass band compared with the case in which the relative band width of the series arm resonator is a small band width that is the same or substantially the same as that of the parallel arm resonator. Thus, even in the case of a wide pass band, it is possible to bring the resonant frequency of the series arm resonator and the anti-resonant frequency of the parallel arm resonator closer together, and therefore the return loss inside the pass band is able to be improved and the insertion loss of the filter is able to be reduced. Furthermore, a steep attenuation characteristic is able to be provided at an end of the pass band by utilizing the frequency characteristic of the parallel arm resonator, which has a small relative band width and in which the impedance falls sharply in the vicinity of the resonant frequency. As a result, a filter is able to be obtained that has a wide pass band, a small insertion loss, and a steep attenuation characteristic at an end of the pass band.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Hereafter, preferred embodiments of the present invention will be described in detail with reference to the accompanying drawings. The preferred embodiments described hereafter each illustrate a comprehensive or specific example of the present invention. The numerical values, shapes, materials, elements, arrangement of the elements, the ways in which the elements are connected to each other and other features and elements in the following preferred embodiments are merely examples and are not intended to limit scope of the present invention.

Preferred Embodiment 1

A filter according to a preferred embodiment 1 of the present invention will be described taking the example of a filter included in a multiplexer.

Figure 1:
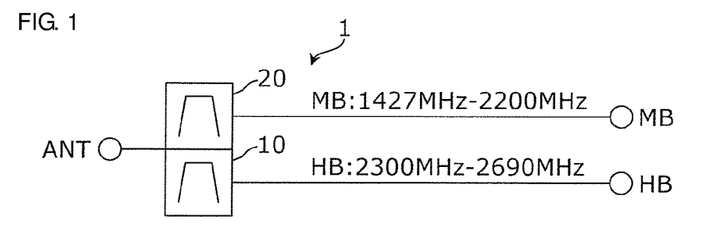
FIG. 1 is a block diagram illustrating an example of the configuration of a multiplexer in which a filter according to a preferred embodiment of the present invention is provided.

FIG. 1 is a block diagram illustrating an example of the configuration of a multiplexer in which the filter according to the preferred embodiment 1 is used. As illustrated in FIG. 1, a multiplexer 1 includes a filter 10 that has a first frequency band as a pass band and a filter 20 that has a second frequency band as a pass band. The multiplexer 1 is preferably, for example, a diplexer that multiplexes and demultiplexes a signal of the first frequency band and a signal of the second frequency band.

In FIG. 1, as an example, the first frequency band is preferably from about 2300 MHz to about 2690 MHz and the second frequency band is preferably from about 1427 MHz to about 2200 MHz. In this specification, for convenience of reference, the frequency band from about 2300 MHz to about 2690 MHz will be referred to as a high band HB and the frequency band from about 1427 MHz to about 2200 MHz will be referred to as a middle band MB.

One end of the filter 10 and one end of the filter 20 are connected to an antenna terminal ANT. The other end of the filter 10 is connected to a high band terminal HB and the other end of the filter 20 is connected to a middle band terminal MB.

In the case in which the filters 10 and 20 each sufficiently reduce or prevent a signal of the other pass band, a signal of the high band HB and a signal of the middle band MB respectively selected by the filters 10 and 20 are able to be simultaneously handled without interference therebetween using one antenna connected to the antenna terminal ANT. That is, carrier aggregation is able to be performed between a communication band belonging to the high band HB and a communication band belonging to the middle band MB using one antenna.

For example, the following bandpass characteristics are demanded for the filter 10 in order to achieve such carrier aggregation.

Figure 2:
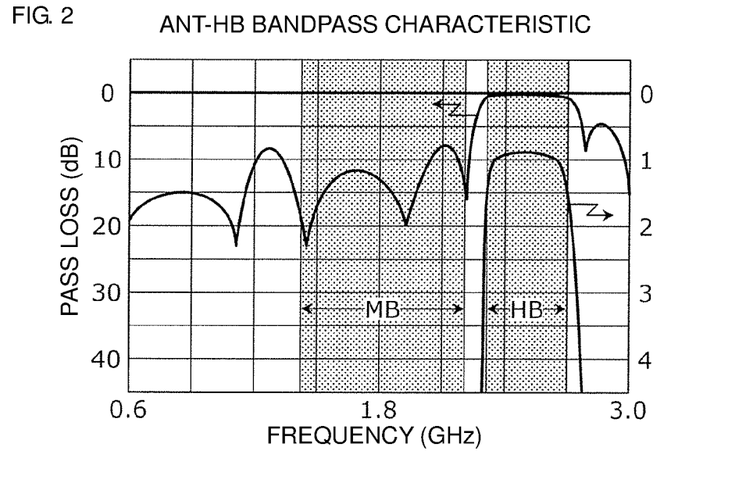
FIG. 2 is a graph for describing the bandpass characteristics obtained by a filter according to a preferred embodiment of the present invention.

FIG. 2 is a graph for describing an example of the bandpass characteristics demanded for the filter 10 (more precisely, the bandpass characteristics between antenna terminal ANT and high band terminal HB of multiplexer 1). As illustrated in FIG. 2, for the filter 10, a demultiplexing performance is required that includes a wide pass band (high band HB with a relative band width of about 15% or more), a wide attenuation band (middle band MB with a relative band width of about 40% or more), and a narrow frequency gap of 100 MHz (a relative band width of about 4%) between the attenuation band and the pass band. Here, the relative bandwidth of a band refers to the ratio between the difference between the upper end (high-frequency end) and the lower end (low-frequency end) of the band and the center frequency of the band.

The inventor of preferred embodiments of the present invention performed research into achieving a filter having such a pass band using the high-frequency circuit of the related art. Hereafter, the results of the research will be described as a comparative example.

Figure 3:
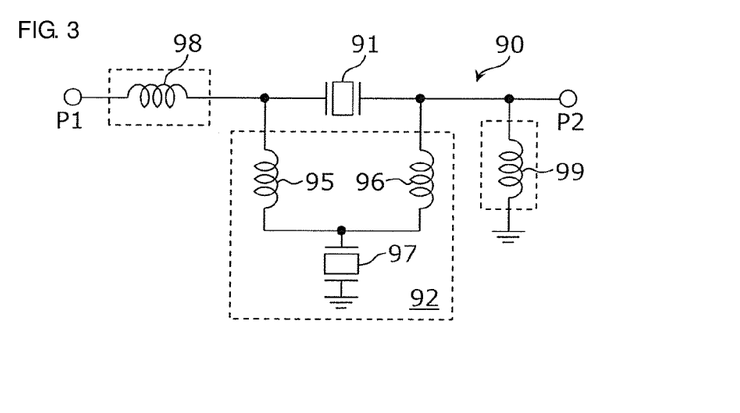
FIG. 3 is a circuit diagram illustrating an example of the configuration of a filter according to a comparative example.

FIG. 3 is a circuit diagram illustrating an example of the configuration of a filter 90 according to a comparative example. As illustrated in FIG. 3, the filter 90 includes matching inductors 98 and 99 added to the high-frequency circuit illustrated in FIG. 13, which includes the elastic wave resonator 91 and the parallel capacitance compensation circuit 92. The parallel capacitance compensation circuit 92 includes the inductors 95 and 96 and the elastic wave resonator 97.

Figure 4:
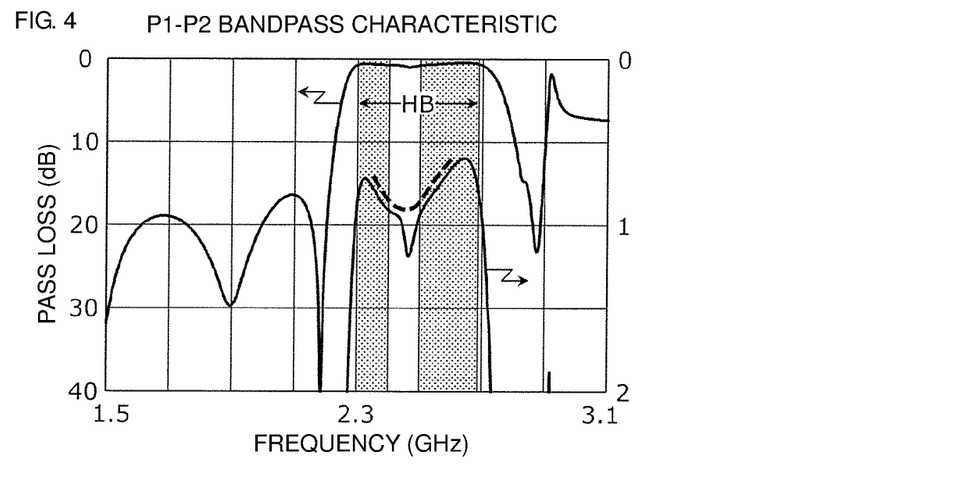
FIG. 4 is a graph illustrating an example of bandpass characteristics of the filter according to the comparative example.

FIG. 4 is a graph illustrating an example of the bandpass characteristics of the filter 90 between terminals P1 and P2. The pass band of the filter 90 was set so as to be divided into a first portion from about 2300 MHz to about 2400 MHz and a second portion from about 2496 MHz to about 2690 MHz as portions of the high band HB in which communication bands that are to be actually used are located (portions that are shaded gray in FIG. 4). An enlarged waveform of a portion of the high band HB is illustrated.

As indicated by the broken line extending along the enlarged waveform in FIG. 4, it is clear that the bandpass characteristics of the filter 90 have a large concave waveform inside the high band HB and that insertion loss in the center of the high band HB is large. In addition, the notch that is seen between the first portion and the second portion arises from an unwanted wave caused by the elastic wave resonator 97 and is intentionally provided in the gap between the pass bands.

Figure 5:
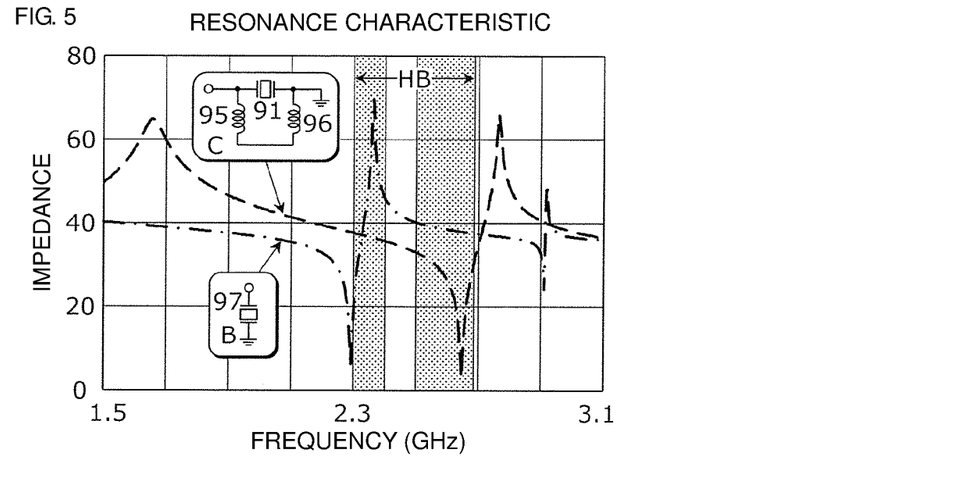
FIG. 5 is a graph illustrating an example of the resonance characteristics of partial circuits of the filter according to the comparative example.

FIG. 5 is a graph illustrating an example of resonance characteristics of partial circuits of the filter 90. FIG. 5 illustrates the respective impedance-frequency characteristics of a partial circuit B including the elastic wave resonator 97 and a partial circuit C including the elastic wave resonator 91 and the inductors 95 and 96. The bandpass characteristics illustrated in FIG. 4 are provided by the combination of the impedances illustrated in FIG. 5.

The bandpass characteristics in FIG. 4 will be analyzed in more detail.

Figure 6A:
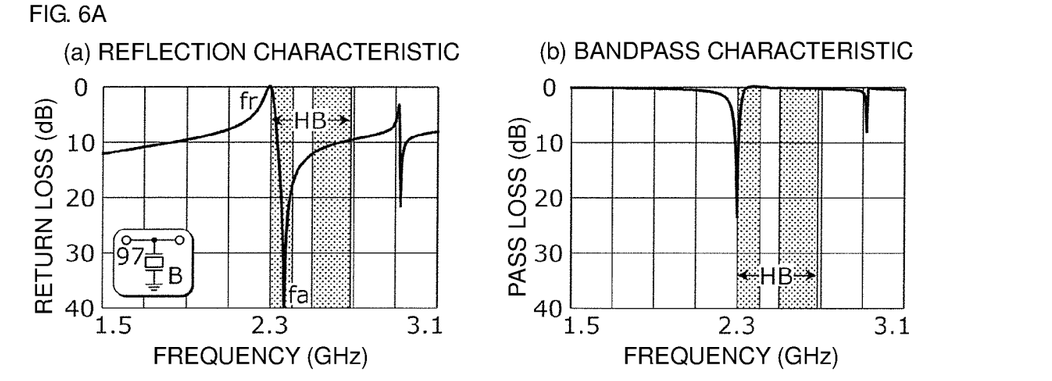
FIG. 6A is a graph illustrating an example of reflection characteristics and bandpass characteristics of a partial circuit of the filter circuit according to the comparative example.

FIG. 6A is a graph illustrating an example of reflection characteristics and bandpass characteristics of the partial circuit B (i.e., the elastic wave resonator 97) of the filter 90, where part (a) illustrates the reflection characteristics and part (b) illustrates the bandpass characteristics. The reflection characteristics and the bandpass characteristics in FIG. 6A are provided as a result of a signal flowing to ground in accordance with the impedance of the partial circuit B illustrated in FIG. 5.

Symbols fr and fa in FIG. 6A respectively indicate the resonant frequency and anti-resonant frequency of the elastic wave resonator 97. The resonant frequency fr of the elastic wave resonator 97 is disposed at the lower end of the high band HB.

The relative band width of an elastic wave resonator is generally narrow. For example, an elastic wave resonator that includes a substrate made of a piezoelectric material containing lithium niobate and in which a signal is transmitted via Raleigh waves propagating along the substrate (hereafter, abbreviated to an LN Raleigh resonator) has a relative band width of several percent. Here, the relative band width of an elastic wave resonator refers to the ratio between the difference between the anti-resonant frequency and the resonant frequency of the elastic wave resonator and the center frequency of the elastic wave resonator.

Steep attenuation is able to be achieved in the bandpass characteristics of partial circuit B at the lower end of the high band HB (part (b) of FIG. 6A) by using an elastic wave resonator having a narrow relative band width, such as an LN Raleigh resonator, for the elastic wave resonator 97.

Figure 6B:
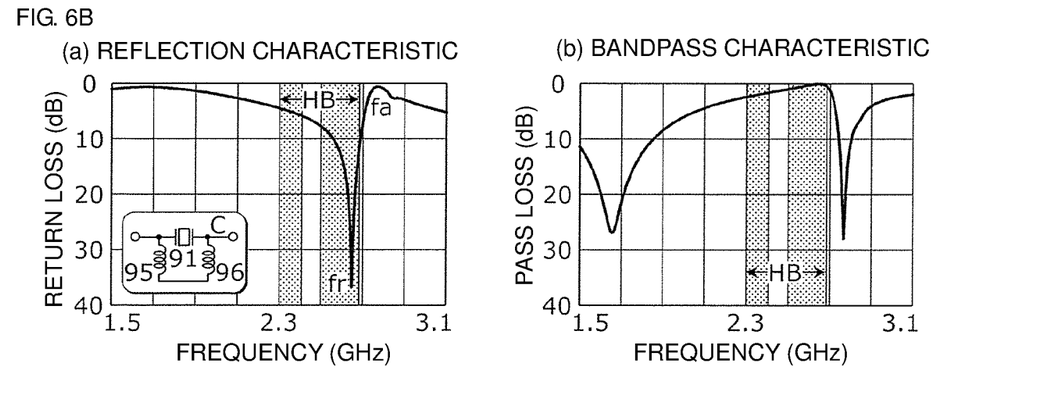
FIG. 6B is a graph illustrating an example of reflection characteristics and bandpass characteristics of a partial circuit of the filter circuit according to the comparative example.

FIG. 6B is a graph illustrating an example of reflection characteristics and bandpass characteristics of the partial circuit C of the filter 90, where part (a) illustrates the reflection characteristics and part (b) illustrates the bandpass characteristics. The reflection characteristics and the bandpass characteristics in FIG. 6B are provided as a result of the passage of a signal being reduced or prevented in accordance with the impedance of the partial circuit C illustrated in FIG. 5.

The symbols fr and fa in FIG. 6B respectively indicate the resonant frequency and the anti-resonant frequency of the partial circuit C. The anti-resonant frequency fa of the partial circuit C is disposed outside the band of the high band HB on the high-frequency side of the high band HB. In the example in FIG. 6B, the elastic wave resonator 91 is defined by an LN Rayleigh resonator, similar to the elastic wave resonator 97.

The relative band width of the partial circuit C is larger than the relative band width of the elastic wave resonator 91 by itself due to the presence of the inductors 95 and 96, but is substantially smaller than the relative band width of the high band HB. Therefore, the resonant frequency fr of the partial circuit C is located in a portion of the high band HB close to the upper end of the high band HB. Thus, the return loss of the partial circuit C changes steeply and by a large amount particularly in the vicinity of the resonant frequency fr inside the high band HB (part (a) in FIG. 6B).

Figure 6C:
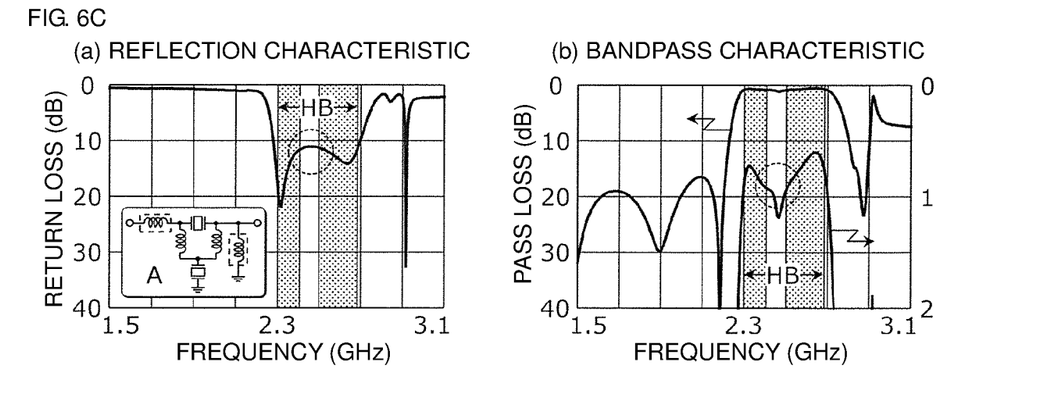
FIG. 6C is a graph illustrating an example of reflection characteristics and bandpass characteristics of the entire filter according to the comparative example.

FIG. 6C is a graph illustrating an example of reflection characteristics and bandpass characteristics of the entirety A of the filter 90, where part (a) illustrates the reflection characteristics and part (b) illustrates the bandpass characteristics. The reflection characteristics and the bandpass characteristics in FIG. 6C are provided by including matching achieved by the inductors 98 and 99 to the combined characteristics of the partial circuits B and C in FIGS. 6A and 6B.

As can be seen from the area inside the broken line circle in part (a) of FIG. 6C, the return loss of the entirety A of the filter 90 is smaller in the center of the high band HB than at the two ends of the high band HB. In other words, reflection of a signal at an input side of the filter 90 is larger in the center of the high band HB. This is because the reflection characteristics of the partial circuit C are too steep and therefore satisfactory return loss cannot be secured in the center of the high band HB.

As a result, as can be seen inside the broken line circle in part (b) of FIG. 6C, the insertion loss of the entirety A of the filter 90 has a large concave waveform inside the high band HB and the insertion loss increases (worsens) in the center of the high band HB.

Based on this research, a filter is obtained in which degradation of the insertion loss is improved by relaxing the steepness of the frequency characteristics of the elastic wave resonator 91 of the filter 90.

Figure 7:
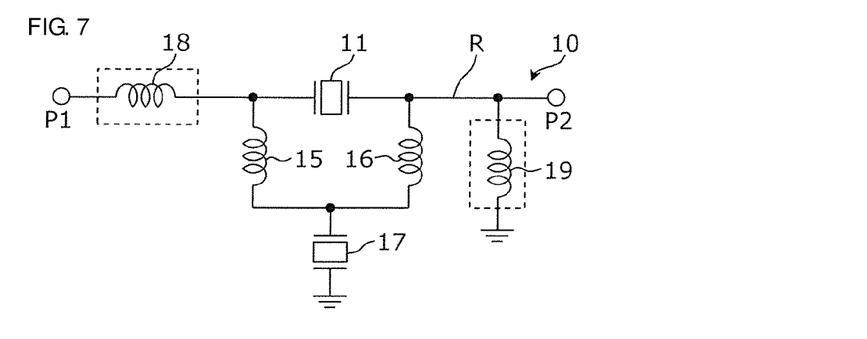
FIG. 7 is a circuit diagram illustrating an example of the configuration of a filter according to a preferred embodiment of the present invention.

FIG. 7 is a circuit diagram illustrating an example of the configuration of a filter according to the preferred embodiment 1. As illustrated in FIG. 7, a filter 10 includes terminals P1 and P2, a signal path R, elastic wave resonators 11 and 17, and inductors 15, 16, 18, and 19.

The elastic wave resonator 11 defines a portion of the signal path R connected between the terminals P1 and P2. The terminals P1 and P2 are respectively examples of a first terminal and a second terminal, and the elastic wave resonator 11 is an example of a series arm resonator.

One end of the elastic wave resonator 17 is connected to ground. The elastic wave resonator 17 is an example of a parallel arm resonator.

One end of the inductor 15 is connected to one end of the elastic wave resonator 11 and the other end of the inductor 15 is connected to the other end of the elastic wave resonator 17. The inductor 15 is an example of a first inductor.

One end of the inductor 16 is connected to the other end of the elastic wave resonator 11 and the other end of the inductor 16 is connected to the other end of the elastic wave resonator 17. The inductor 16 is an example of a second inductor.

One end of the inductor 18 is connected to the terminal P1, the other end of the inductor 18 is connected to the one end of the elastic wave resonator 11, and the inductor 18 defines a portion of the signal path R. The inductor 18 is an example of a matching third inductor that is connected to a portion of the signal path between the series arm resonator and the first terminal.

One end of the inductor 19 is connected to a portion of the signal path R between the elastic wave resonator 11 and the terminal P2 and the other end of the inductor 19 is connected to ground. The inductor 19 is an example of a matching third inductor that is connected to a portion of the signal path between the series arm resonator and the second terminal.

The filter 10 is preferably the same or substantially the same as a filter obtained by replacing the elastic wave resonator 91 in the filter 90 in FIG. 3 with the elastic wave resonator 11. The elastic wave resonator 91 is an LN Rayleigh resonator, whereas the elastic wave resonator 11 is preferably, for example, an LN Love resonator. The elastic wave resonator 17 and the inductors 15, 16, 18, and 19 of the filter 10 respectively correspond to the elastic wave resonator 97 and the inductors 95, 96, 98, and 99 of the filter 90. The elastic wave resonators 17 and 97 are preferably both, for example, LN Rayleigh resonators.

Figure 8:
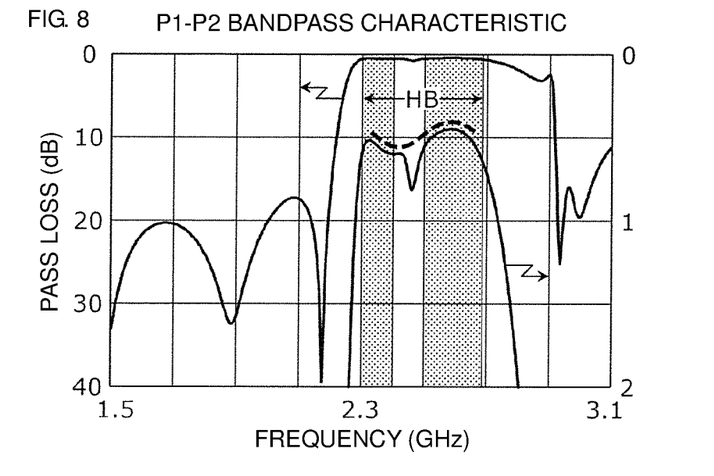
FIG. 8 is a graph illustrating an example of bandpass characteristics of a filter according to a preferred embodiment of the present invention.

FIG. 8 is a graph illustrating an example of the bandpass characteristics of the filter 10 between the terminals P1 and P2. The pass band of the filter 10 was set so as to be divided into a first portion from about 2300 MHz to about 2400 MHz and a second portion from about 2496 MHz to about 2690 MHz as portions of the high band HB in which communication bands that are to be actually used are located (shaded gray in FIG. 8). An enlarged waveform of a portion of the high band HB is illustrated.

As indicated by the broken line extending along the enlarged waveform in FIG. 8, it is clear that the bandpass characteristics of the filter 10 have a waveform in which the concave shape is reduced compared to FIG. 4 and that insertion loss in the center of the high band HB is reduced (improved).

Figure 9:
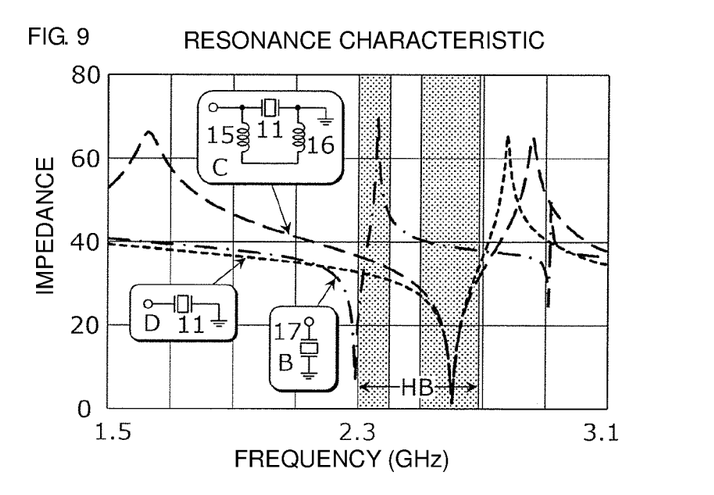
FIG. 9 is a graph illustrating an example of resonance characteristics of partial circuits of a filter according to a preferred embodiment of the present invention.

FIG. 9 is a graph illustrating an example of resonance characteristics of partial circuits of the filter 10. FIG. 9 illustrates the respective impedance-frequency characteristics of a partial circuit B including the elastic wave resonator 17 (LN Rayleigh resonator), a partial circuit C including the elastic wave resonator 11 (LN Love resonator) and the inductors 15 and 16, and a partial circuit D including the elastic wave resonator 11 (LN Love resonator). The bandpass characteristics illustrated in FIG. 8 is provided by the combination of the impedances illustrated in FIG. 9.

Here, notice that the gap between the anti-resonant frequency and the resonant frequency is widened in the partial circuit C of the filter 10, compared with the partial circuit C of the filter 90 (FIG. 5), due to the elastic wave resonator 11 being an LN Love resonator, which has a larger relative band width than an LN Rayleigh resonator.

The bandpass characteristics in FIG. 8 will be analyzed in more detail.

Figure 10A:
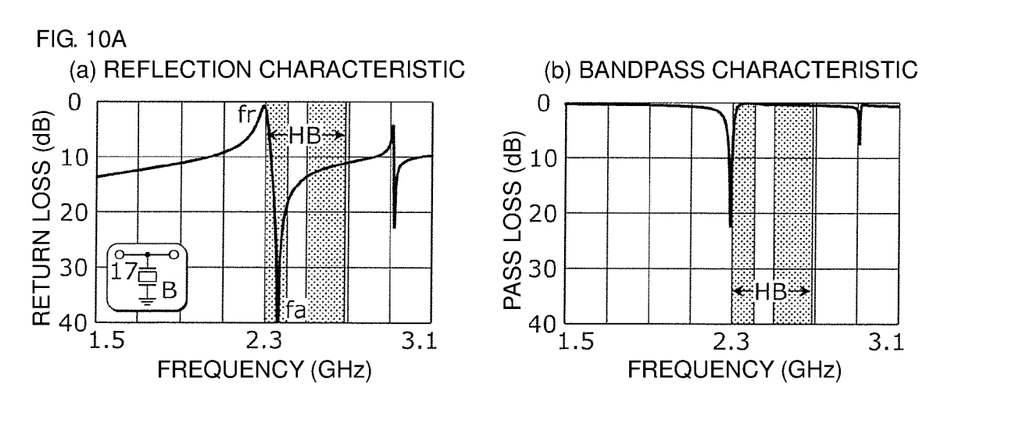
FIG. 10A is a graph illustrating an example of reflection characteristics and bandpass characteristics of a partial circuit of a filter according to a preferred embodiment of the present invention.

FIG. 10A is a graph illustrating an example of reflection characteristics and a bandpass characteristics of the partial circuit B (i.e., the elastic wave resonator 17) of the filter 10, where part (a) illustrates the reflection characteristics and part (b) illustrates the bandpass characteristics. Symbols fr and fa in FIG. 10A respectively indicate the resonant frequency and anti-resonant frequency of the elastic wave resonator 17. The features of the reflection characteristics and the bandpass characteristics in FIG. 10A are the same or substantially the same as those described for the partial circuit B of the filter 90 in FIG. 6A, and therefore description thereof is omitted.

As described using FIG. 6A, steep attenuation is able to be provided in the bandpass characteristics of the partial circuit B at the lower end of the high band HB (part (b) of FIG. 10A) by using an LN Rayleigh resonator having a narrow relative band width for the elastic wave resonator 17.

Figure 10B:
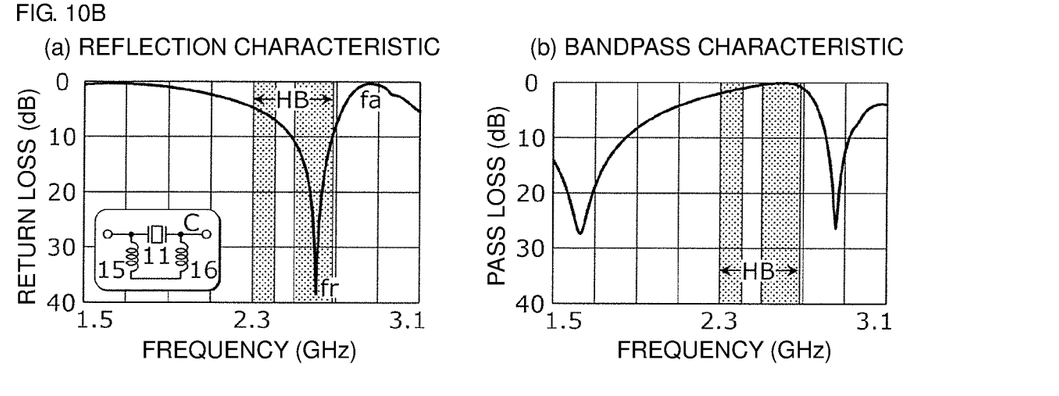
FIG. 10B is a graph illustrating an example of reflection characteristics and bandpass characteristics of a partial circuit of a filter according to a preferred embodiment of the present invention.

FIG. 10B is a graph illustrating an example of the reflection characteristics and the bandpass characteristics of the partial circuit C of the filter 10, where part (a) illustrates the reflection characteristics and part (b) illustrates the bandpass characteristics. The symbols fr and fa in FIG. 10B respectively indicate the resonant frequency and the anti-resonant frequency of the partial circuit C. The gap between the anti-resonant frequency and the resonant frequency of the partial circuit C of filter 10 is larger than the gap between the anti-resonant frequency and the resonant frequency of the partial circuit C of the filter 90 illustrated in part (a) of FIG. 6B due to the elastic wave resonator 11 being an LN Love resonator.

Therefore, it is possible to provide the resonant frequency fr of the partial circuit C of the filter 10 inside the band of the high band HB so as to be spaced apart from the high-frequency end of the high band HB while providing the anti-resonant frequency fa of the partial circuit C outside the band of the high band HB on the high-frequency side of the high band HB.

Figure 10C:
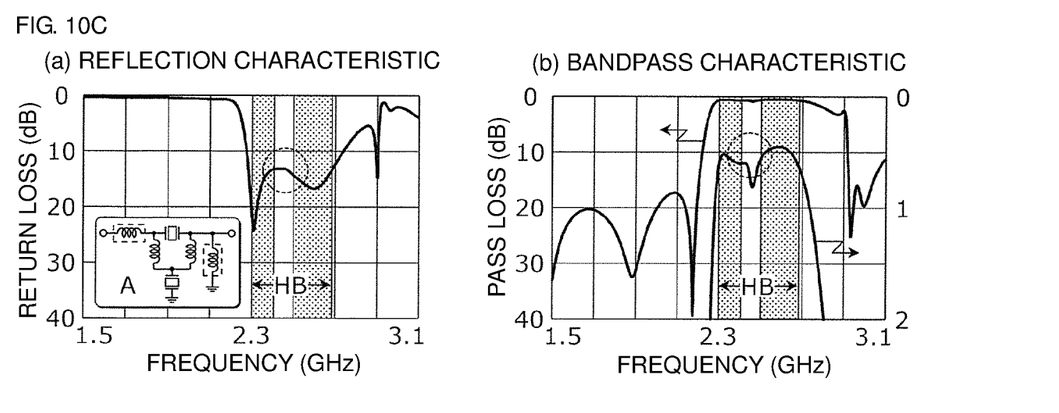
FIG. 10C is a graph illustrating an example of reflection characteristics and bandpass characteristics of an entire filter according to a preferred embodiment of the present invention.

FIG. 10C is a graph illustrating an example of the reflection characteristics and the bandpass characteristics of the entirety A of the filter 10, where part (a) illustrates the reflection characteristics and part (b) illustrates the bandpass characteristic.

As seen from the area inside the broken line circle in part (a) of FIG. 10C, the return loss is maintained at a large value in the center of the high band HB compared with the return loss of the filter 90 illustrated in part (a) of FIG. 6C. This is because the resonant frequency fr of the partial circuit C is inside the band of the high band HB so as to be spaced away from the high-frequency end of the high band HB and a satisfactory return loss is ensured in the center of the high band HB, and consequently good matching is able to be obtained over the entire high band HB using the inductors 18 and 19.

As a result, as seen inside the broken line circle in part (b) of FIG. 10C, the insertion loss of the entirety A of the filter 10 has a waveform that does not include a large concave portion inside the high band HB and the insertion loss is reduced (improved) in the center of the high band HB.

Thus, according to the filter 10, as a result of the elastic wave resonator 11 being an LN Love resonator, matching is easily achieved inside the pass band, and consequently, the insertion loss inside the pass band is reduced (improved) compared with the filter 90 in which the series arm resonator is an LN Rayleigh resonator. The steep attenuation characteristic at the low-frequency end of the pass band of the filter 10 is provided due to the elastic wave resonator disposed in the parallel arm being an LN Rayleigh resonator having a steep frequency characteristic, similar to in the filter 90.

Thus, a filter is able to be obtained that has a wide pass band, a small insertion loss, and a steep attenuation characteristic at an end of the pass band.

The configuration of the filter 10 described above is merely an example, and modifications or restrictions such as those described hereafter may be made to the filter 10, for example.

For example, the inductors 15 and 16 in the filter 10 may be multilayer chip inductors. With this configuration, the Q values of the inductors 15 and 16 is able to be increased compared with the case in which the inductors 15 and 16 are defined by patterned conductors inside a substrate. As a result, the insertion loss of the filter 10 is able to be further reduced.

Furthermore, the Q values of the inductors 15 and 16 may be higher than the Q values of the matching inductors 18 and 19.

According to this configuration, since inductors having comparatively high Q values (for example, inductors having Q values higher than those of the inductors 18 and 19) are used as the inductors 15 and 16, the insertion loss is able to be reduced across a wide pass band while increasing the steepness of the attenuation characteristic at the low-frequency end of the pass band.

Furthermore, the inductance value of the inductor 15 may be larger than the inductance value of the inductor 16.

According to this configuration, the steepness of the attenuation characteristic at the low-frequency end of the pass band is able to be further increased.

The above description has been made using the high band HB (or the first portion and the second portion included in the high band HB) as an example of the pass band of the filter 10, but the pass band of the filter 10 is not limited to the frequency band referred to as the high band HB. The filter 10 may be used as a filter in which the pass band is an arbitrary frequency band having a wide band width and for which there is another frequency band that is adjacent to the low-frequency side thereof with a small frequency gap therebetween.

Preferred Embodiment 2

A multiplexer according to a preferred embodiment 2 of the present invention will be described using a triplexer including the filter of the preferred embodiment 1 as an example.

Figure 11:
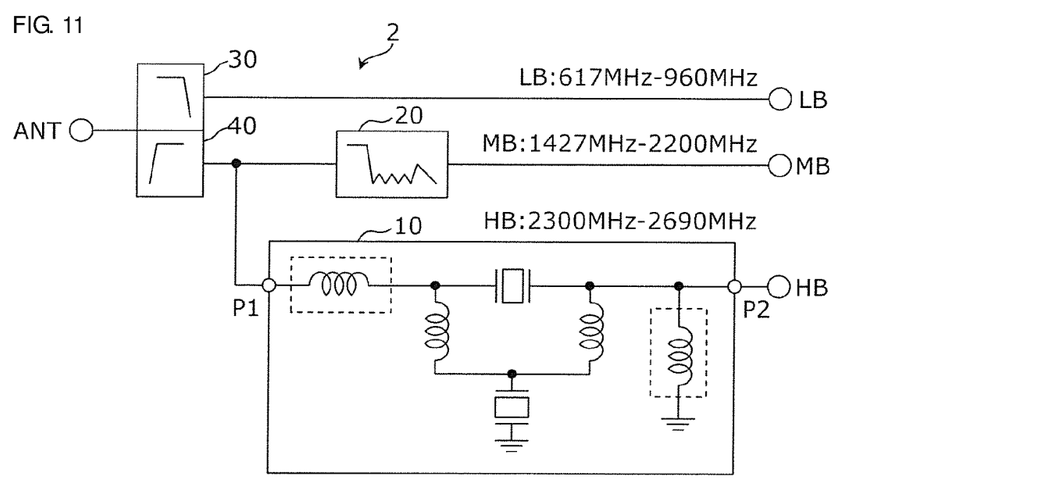
FIG. 11 is a block diagram illustrating an example of the configuration of a multiplexer according to a preferred embodiment of the present invention.

FIG. 11 is a block diagram illustrating an example of the configuration of the multiplexer according to the preferred embodiment 2. As illustrated in FIG. 11, a multiplexer 2 includes filters 30 and 40 in addition to the filters 10 and 20 according to the preferred embodiment 1. The multiplexer 2 is preferably, for example, a triplexer that multiplexes and demultiplexes signals of the pass bands of the filters 10, 20, and 30. The filters 10, 20, and 30 are examples of a first filter, a second filter, and a third filter, respectively.

In FIG. 11, the pass band of the filter 30 is preferably from about 617 MHz to about 960 MHz, as an example. In this specification, for convenience of reference, the frequency band from about 617 MHz to about 960 MHz is referred to as a low band LB.

The pass band of the filter 10 is preferably, for example, the high band HB from about 2300 MHz to about 2690 MHz and the pass band of the filter 20 is preferably, for example, the middle band MB from about 1427 MHz to about 2200 MHz. The filter 40 preferably has, for example, a pass band that is a combination of the high band HB and the middle band MB.

One end of the filter 30 and one end of the filter 40 are connected to an antenna terminal ANT. The other end of the filter 30 is connected to a low-band terminal LB. One end of the filter 10 and one end of the filter 20 are connected to the other end of the filter 40. The other end of the filter 10 is connected to a high band terminal HB and the other end of the filter 20 is connected to a middle band terminal MB. In other words, one ends of the filters 10, 20, and 30 are directly connected to each other or are connected to each other via the filter 40.

The filter 20 includes an LC resonant circuit and an elastic wave resonator (not illustrated). An LC resonant circuit of the filter 20 provides a wide pass band for the middle band MB and provides a steep attenuation characteristic outside the pass band at the high-frequency side of the middle band MB.

The filter 30 is preferably, for example, an LC resonant circuit. The LC resonant circuit of the filter 30 provides a wide pass band for the low band LB.

Figure 12:
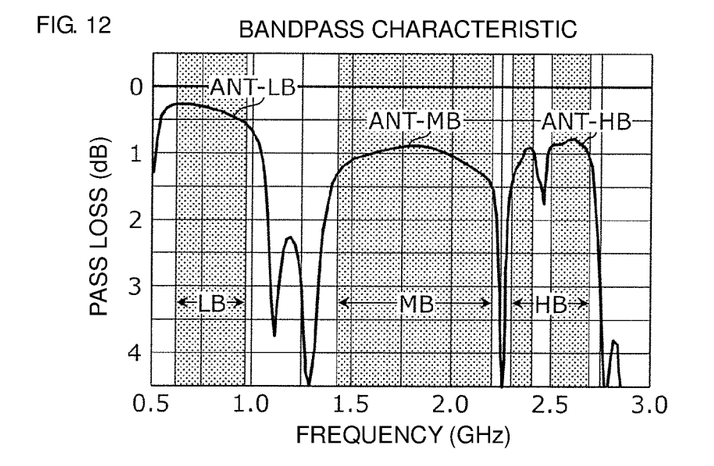
FIG. 12 is a graph illustrating an example of bandpass characteristics of a multiplexer according to a preferred embodiment of the present invention.

FIG. 12 is a graph illustrating an example of the bandpass characteristics of the multiplexer 2. In the filter 20 used for the middle band MB in the multiplexer 2, a steep attenuation characteristic is able to be provided at the high-frequency end of the pass band and a signal of the high band HB is able to be sufficiently stopped or attenuated by utilizing the steep frequency characteristic of the elastic wave resonator. Since a signal of the high band HB and a signal of the middle band MB are completely isolated from each other in spite of the narrow frequency gap therebetween by using the filters 10 and 20, both signals are able to be simultaneously transmitted and received using a single antenna. Consequently, carrier aggregation communication using the combination of a communication band included in the high band HB and a communication band included in the middle band MB is able to be performed using a single antenna.

Although filters and multiplexers according to preferred embodiments of the present invention have been described above, the present invention is not limited to individual preferred embodiments. Various modifications, as thought of by those skilled in the art, made to the preferred embodiments and other preferred embodiments obtained by combining elements of different preferred embodiments may also be included in the scope of the present invention as long as the modifications and preferred embodiments do not depart from the spirit of the present invention.

A filter according to a preferred embodiment of the present invention includes a series arm resonator that defines at least a portion of a signal path connected between a first terminal and a second terminal, a parallel arm resonator including one end that is grounded, a first inductor including one end that is connected to one end of the series arm resonator and another end that is connected to another end of the parallel arm resonator, and a second inductor having one end that is connected to another end of the series arm resonator and another end that is connected to the other end of the parallel arm resonator. A relative band width of the series arm resonator is larger than a relative band width of the parallel arm resonator.

In a typical filter, the resonant frequency of a parallel arm resonator is disposed at a low-frequency end of the pass band and the anti-resonant frequency of a series arm resonator is disposed outside the pass band on the high-frequency side of the pass band. Therefore, if a resonator having a small relative band width is used for both of the series arm resonator and the parallel arm resonator, the anti-resonant frequency of the parallel arm resonator and the resonant frequency of the series arm resonator will be close to the two ends of the pass band inside the pass band and will be greatly separated from each other. Consequently, return loss inside the pass band will be degraded and insertion loss will be increased. This increase in insertion loss becomes more pronounced the wider the pass band becomes.

The series arm resonator has a larger relative band width than the parallel arm resonator in the above-described preferred embodiments due to the fact that a parallel arm resonator having a small relative band width is an effective way to obtain a steep frequency characteristic at the low-frequency end of the pass band.

With this configuration, the resonant frequency of the series arm resonator is able to be moved farther away from the high-frequency end of the pass band compared with the case in which the series arm resonator has a small relative band width the same as or similar to the parallel arm resonator. Thus, even in the case of a wide pass band, it is possible to bring the resonant frequency of the series arm resonator and the anti-resonant frequency of the parallel arm resonator closer together.

As a result, the return loss inside the pass band is able to be improved and the insertion loss of the filter is able to be reduced. Furthermore, a steep attenuation characteristic is able to be provided at an end of the pass band by utilizing the frequency characteristic of the parallel arm resonator, which has a small relative band width and in which the impedance falls sharply in the vicinity of the resonant frequency. As a result, a filter is able to be obtained that has a wide pass band, a small insertion loss, and a steep attenuation characteristic at an end of the pass band.

In addition, the parallel arm resonator may include a substrate made of a piezoelectric material containing lithium niobate and a signal may be transmitted in the parallel arm resonator via Rayleigh waves that propagate along the substrate, and the series arm resonator may include a substrate made of a piezoelectric material containing lithium niobate and a signal may be transmitted in the series arm resonator via Love waves that propagate along the substrate.

Regarding this configuration, it is known that the frequency characteristic of an elastic wave resonator that includes a substrate made of a piezoelectric material containing lithium niobate and in which a signal is transmitted via Rayleigh waves that propagate along the substrate (LN Rayleigh resonator) has particularly high steepness. Therefore, a steep attenuation characteristic is able to be provided at the low-frequency end of the pass band of the filter by using an LN Rayleigh resonator for the parallel arm resonator.

In addition, it is known that an elastic wave resonator including a substrate made of a piezoelectric material containing lithium niobate and in which a signal is transmitted via Love waves that propagate along the substrate (LN Love resonator) has a large relative band width compared with an LN Rayleigh resonator. Therefore, the return loss inside the pass band is able to be effectively improved and the insertion loss of the filter is able to be reduced by using an LN Love resonator for the series arm resonator.

Furthermore, the filter may include a matching third inductor that is connected to at least one of a portion of the signal path between the series arm resonator and the first terminal and a portion of the signal path between the series arm resonator and the second terminal, and a Q value of the first inductor and a Q value of the second inductor may both be higher than a Q value of the third inductor in a pass band of the filter.

According to this configuration, since inductors having comparatively high Q values are used as the first inductor and the second inductor, the insertion loss is able to be reduced across a wide pass band while making the steepness of the attenuation characteristic high at the low-frequency end of the pass band.

Furthermore, the first inductor and the second inductor may be multilayer chip inductors.

According to this configuration, the first inductor and the second inductor are multilayer chip inductors. Thus, the Q values of the first inductor and the second inductor are able to be increased compared with the case in which the first inductor and the second inductor are patterned inductors inside a substrate. As a result, the insertion loss of the filter is able to be further reduced.

In addition, an inductance value of the first inductor may be larger than an inductance value of the second inductor.

According to this configuration, the steepness of the attenuation characteristic at the low-frequency end of the pass band is able to be further increased.

In addition, the filter may have a pass band from about 2300 MHz to about 2400 MHz and from about 2496 MHz to about 2690 MHz and may have a stop band from about 1427 MHz to about 2200 MHz.

With this configuration, a filter is able to be obtained in which a pass band and a stop band thereof are respectively the high band and the middle band specifically described in this specification. This filter is suitable for use as a high-band filter of a multiplexer that multiplexes and demultiplexes signals of a high band and a middle band.

In addition, a multiplexer according to a preferred embodiment of the present invention includes a first filter according to a preferred embodiment of the present invention, a second filter having a pass band from about 1427 MHz to about 2200 MHz, and a third filter having a pass band from about 617 MHz to about 960 MHz. One end of the first filter, one end of the second filter, and one end of the third filter are connected to each other.

According to this configuration, a multiplexer is able to be obtained that multiplexes and demultiplexes signal of three frequency bands, where the low band described in this specification has been added to the above-described high band and middle band.

In addition, the second filter may include an LC resonant circuit and an elastic wave resonator, and the third filter may include an LC resonant circuit.

According to this configuration, in the second filter for the middle band, a steep attenuation characteristic is able to be provided at the high-frequency end of the pass band by utilizing the steep frequency characteristic of the elastic wave resonator. As a result of using the first filter and the second filter, a high-band signal and a middle-band signal are completely isolated from each other in terms of frequency and both signals are able to be simultaneously transmitted and received using a single antenna. Consequently, carrier aggregation communication using the combination of a communication band included in the high band and a communication band included in the middle band is able to be performed using a single antenna.

Preferred embodiments of the present invention may be widely used in communication devices, such as cellular phones as a filter and a multiplexer, for example.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A filter comprising:
   a series arm resonator that defines at least a portion of a signal path connected between a first terminal and a second terminal;
   a parallel arm resonator including one end that is grounded;
   a first inductor including one end that is connected to one end of the series arm resonator and another end that is connected to another end of the parallel arm resonator; and
   a second inductor including one end that is connected to another end of the series arm resonator and another end that is connected to the another end of the parallel arm resonator; wherein
   a relative band width of the series arm resonator is larger than a relative band width of the parallel arm resonator.

2. The filter according to claim 1, wherein
   the parallel arm resonator includes a substrate made of a piezoelectric material containing lithium niobate and a signal is transmitted in the parallel arm resonator via Rayleigh waves that propagate along the substrate; and
   the series arm resonator includes a substrate made of a piezoelectric material containing lithium niobate and a signal is transmitted in the series arm resonator via Love waves that propagate along the substrate.

3. The filter according to claim 1, further comprising:
   a matching third inductor that is connected to at least one of a portion of the signal path between the series arm resonator and the first terminal and a portion of the signal path between the series arm resonator and the second terminal; wherein
   a Q value of the first inductor and a Q value of the second inductor are both higher than a Q value of the third inductor in a pass band of the filter.

4. The filter according to claim 1, wherein the first inductor and the second inductor are multilayer chip inductors.

5. The filter according to claim 1, wherein an inductance value of the first inductor is larger than an inductance value of the second inductor.

6. The filter according to claim 1, wherein the filter has a pass band from about 2300 MHz to about 2400 MHz and from about 2496 MHz to about 2690 MHz and has a stop band from about 1427 MHz to about 2200 MHz.

7. The filter according to claim 3, wherein the matching third inductor includes one end connected to the portion of the signal path between the series arm resonator and the second terminal and another end that is grounded.

8. A multiplexer comprising:
a first filter defined by the filter according to claim 6;
a second filter having a pass band from about 1427 MHz to about 2200 MHz; and
a third filter having a pass band from about 617 MHz to about 960 MHz; wherein
one end of the first filter, one end of the second filter, and one end of the third filter are connected to each other.

9. The multiplexer according to claim 8, wherein
the second filter includes an LC resonant circuit and an elastic wave resonator; and
the third filter includes an LC resonant circuit.

10. The multiplexer according to claim 8, wherein
the parallel arm resonator includes a substrate made of a piezoelectric material containing lithium niobate and a signal is transmitted in the parallel arm resonator via Rayleigh waves that propagate along the substrate; and
the series arm resonator includes a substrate made of a piezoelectric material containing lithium niobate and a signal is transmitted in the series arm resonator via Love waves that propagate along the substrate.

11. The multiplexer according to claim 8, further comprising:
a matching third inductor that is connected to at least one of a portion of the signal path between the series arm resonator and the first terminal and a portion of the signal path between the series arm resonator and the second terminal; wherein
a Q value of the first inductor and a Q value of the second inductor are both higher than a Q value of the third inductor in a pass band of the filter.

12. The multiplexer according to claim 8, wherein the first inductor and the second inductor are multilayer chip inductors.

13. The multiplexer according to claim 8, wherein an inductance value of the first inductor is larger than an inductance value of the second inductor.

14. The multiplexer according to claim 11, wherein the matching third inductor includes one end connected to the portion of the signal path between the series arm resonator and the second terminal and another end that is grounded.

* * * * *